(12) United States Patent
Wu et al.

(10) Patent No.: US 9,893,309 B2
(45) Date of Patent: Feb. 13, 2018

(54) ORGANIC ELECTROLUMINESCENT DISPLAY DEVICE AND DISPLAY APPARATUS

(71) Applicant: BOE Technology Group Co., Ltd., Beijing (CN)

(72) Inventors: Chang-Yen Wu, Beijing (CN); Chin-Lung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/093,166

(22) Filed: Apr. 7, 2016

(65) Prior Publication Data
US 2017/0040561 A1 Feb. 9, 2017

(30) Foreign Application Priority Data

Aug. 7, 2015 (CN) .......................... 2015 1 0484978

(51) Int. Cl.
*H01L 51/50* (2006.01)
*H01L 27/32* (2006.01)
*H01L 51/00* (2006.01)

(52) U.S. Cl.
CPC ........ *H01L 51/504* (2013.01); *H01L 27/3211* (2013.01); *H01L 51/0067* (2013.01);
(Continued)

(58) Field of Classification Search
CPC . H01L 51/504; H01L 51/5088; H01L 51/001; H01L 51/5016; H01L 51/5056;
(Continued)

(56) References Cited

U.S. PATENT DOCUMENTS

2004/0161632 A1* 8/2004 Seo ..................... H01L 51/0052
428/690
2007/0046185 A1* 3/2007 Kim .................... H01L 27/3218
313/504
(Continued)

FOREIGN PATENT DOCUMENTS

CN 103050632 A 4/2013
CN 103682116 A 3/2014
(Continued)

OTHER PUBLICATIONS

First Chinese Office Action, for Chinese Patent Application No. 201510484978.4, dated Oct. 28, 2016, 11 pages.
(Continued)

*Primary Examiner* — Fernando L Toledo
*Assistant Examiner* — Adam S Bowen
(74) *Attorney, Agent, or Firm* — Kinney & Lange, P.A.

(57) ABSTRACT

Embodiments of the present invention disclose an organic electroluminescent display device and a display apparatus. The display device includes: a base substrate, and a first electrode, an organic light emitting layer and a second electrode arranged sequentially on the base substrate, the organic light emitting layer includes a first light emitting sub-layer and a second light emitting sub-layer arranged in stack, the first light emitting sub-layer having a coverage area less than that of the second light emitting sub-layer; a connecting layer is formed by an electron-transporting material and provided between the first light emitting sub-layer and the second light emitting sub-layer; and projection areas of a pattern of the connecting layer and the first light emitting sub-layer on the base substrate are overlapped with each other. It may suppress abnormal color of light from the organic light emitting layer and improve the luminescence efficiency of the display device.

20 Claims, 3 Drawing Sheets

(52) U.S. Cl.
CPC ...... *H01L 51/0072* (2013.01); *H01L 51/0073* (2013.01); *H01L 51/0081* (2013.01); *H01L 51/5016* (2013.01); *H01L 51/5044* (2013.01); *H01L 51/5056* (2013.01); *H01L 51/5072* (2013.01); *H01L 51/5088* (2013.01); *H01L 51/5092* (2013.01); *H01L 51/001* (2013.01); *H01L 51/0003* (2013.01); *H01L 2251/5376* (2013.01)

(58) Field of Classification Search
CPC ............ H01L 51/5072; H01L 51/0003; H01L 51/5092; H01L 51/0081; H01L 51/0067; H01L 51/0072; H01L 51/0073; H01L 2251/5376
USPC .......................................................... 257/40
See application file for complete search history.

(56) References Cited

U.S. PATENT DOCUMENTS

| | | | | |
|---|---|---|---|---|
| 2009/0294778 | A1* | 12/2009 | Mitsuya | H01L 51/5036 257/79 |
| 2011/0101398 | A1* | 5/2011 | Uchida | H01L 27/3211 257/98 |
| 2012/0241726 | A1* | 9/2012 | Kijima | H01L 51/5278 257/40 |
| 2012/0286300 | A1* | 11/2012 | Kijima | H01L 51/5275 257/88 |
| 2012/0292647 | A1* | 11/2012 | Lee | H01L 27/3206 257/89 |
| 2013/0168652 | A1* | 7/2013 | Nam | H01L 51/50 257/40 |

FOREIGN PATENT DOCUMENTS

| | | |
|---|---|---|
| CN | 104393184 A | 3/2015 |
| CN | 104600201 A | 5/2015 |
| CN | 104681580 A | 6/2015 |
| JP | 2007066862 A | 3/2007 |

OTHER PUBLICATIONS

Second Chinese Office Action, for Chinese Patent Application No. 201510484978.4, dated Aug. 4, 2017, 10 pages.

Chinese Rejection Decision, for Chinese Patent Application No. 201510484978.4, dated Jan. 22, 2017, 12 pages.

\* cited by examiner

ORGANIC ELECTROLUMINESCENT DISPLAY DEVICE AND DISPLAY APPARATUS

CROSS-REFERENCE TO RELATED APPLICATION

This application claims benefits of Chinese Patent Application No. 201510484978.4, filed on Aug. 7, 2015 in the State Intellectual Property Office of China, which is incorporated herein by reference in entirety.

BACKGROUND OF THE INVENTION

Field of the Invention

The present disclosure relates to technical field of display, and in particular to an organic electroluminescent display device and a display apparatus.

Description of the Related Art

Typically, an organic electroluminescent display device (for example, an organic light emitting diode (OLED)) means a device which achieves display function by a phenomenon that an organic semiconductor light emitting material emits a light by current carriers injection and recombination with being driven by an electrical field. The organic electroluminescent display device has advantages such as less thickness, low weight, active luminescence (no backlight source), no issue for visual angle, high definition, high brightness, rapid response, low power consumption, wide range of working temperature, strong antivibration, low costs and achieving flexible display.

The organic electroluminescent display device typically includes a base substrate, an anode, a light emitting layer and a cathode. The light emitting layer may include organic light emitting materials with several colors. Its luminescence principle is in that when the anode and the cathode are applied with voltages respectively to form electrical current, electrons in the cathode and holes in the anode may be recombined in the light emitting layer to form excitons that excite the organic materials in the light emitting layer to emit light. Properties of interfaces among various film layers of the organic electroluminescent display device are in particular important. The conventional organic electroluminescent display device is produced by co-using two processes, i.e., solution process and vacuum thermal evaporation process. On two sides of the interface under different processes, different materials are provided. However, during the conversion between the two processes, the properties of the heterogeneous interface will be affected so that color of the light from the light emitting layer may tend to be abnormal.

SUMMARY

An embodiment of the present invention provides an organic electroluminescent display device, including: a base substrate, and a first electrode, an organic light emitting layer and a second electrode arranged sequentially on the base substrate, wherein the organic light emitting layer comprises a first light emitting sub-layer and a second light emitting sub-layer arranged in stack, the first light emitting sub-layer having a coverage area less than that of the second light emitting sub-layer; wherein a connecting layer is formed by an electron-transporting material and provided between the first light emitting sub-layer and the second light emitting sub-layer; and wherein a projection area of a pattern of the connecting layer and a projection area of the first light emitting sub-layer on the base substrate are overlapped with each other.

An embodiment of the present invention provides a display apparatus including an organic electroluminescent display device, the organic electroluminescent display device including: a base substrate, and a first electrode, an organic light emitting layer and a second electrode arranged sequentially on the base substrate, wherein the organic light emitting layer comprises a first light emitting sub-layer and a second light emitting sub-layer, the first light emitting sub-layer having a coverage area less than that of the second light emitting sub-layer; wherein a connecting layer is formed by an electron-transporting material and provided between the first light emitting sub-layer and the second light emitting sub-layer; and wherein a projection area of a pattern of the connecting layer and a projection area of the first light emitting sub-layer on the base substrate are overlapped with each other.

BRIEF DESCRIPTION OF THE DRAWINGS

FIG. 1b is a graph showing spectrum of light emitted from a region in which a green light emitting material is located in the organic electroluminescent display device shown in FIG. 1a;

DETAILED DESCRIPTION OF PREFERRED EMBODIMENTS OF THE INVENTION

The organic electroluminescent display device and display device according to embodiments of the present invention will be further explained below with reference to the figures.

Thicknesses and shapes of various film layers shown in figures are not intended to represent real scales of the organic electroluminescent display device, but are only used to illustrate the present disclosure by way of examples. In addition, for the purpose of explanation, numerous specific details are set forth in the following detailed description to provide a thorough understanding to the embodiments of the present invention. It is obvious, however, that one or more embodiments can also be implemented without these specific details. In other instances, well-known structures and devices are shown in an illustrative manner so as to simplify the drawings.

Figure 1A:
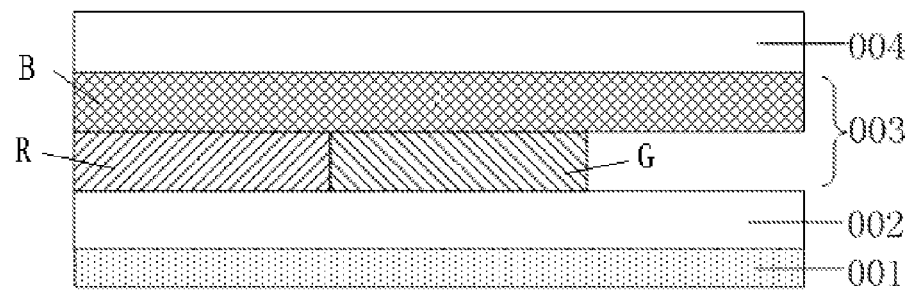
FIG. 1a is a schematic view showing a structure of a typical organic electroluminescent display device.

FIG. 1a shows a typical structure of an organic electroluminescent display device. The organic electroluminescent display device includes: a base substrate 001, and an anode 002, an organic light emitting layer 003 and a cathode 004 arranged sequentially on the base substrate 001. The organic light emitting layer 003 includes three colors, i.e., red R, green G and blue B organic light emitting materials. Its principle of emitting light is in that electrons in the cathode 004 and holes in the anode 002 may be recombined in the light emitting layer 003 to form excitons to excite the organic materials in the light emitting layer 003 to emit light when the anode 002 and the cathode 004 are energized by a voltage to form electrical current. Properties of interfaces among various film layers of the organic electroluminescent display device are especially important.

Figure 1B:
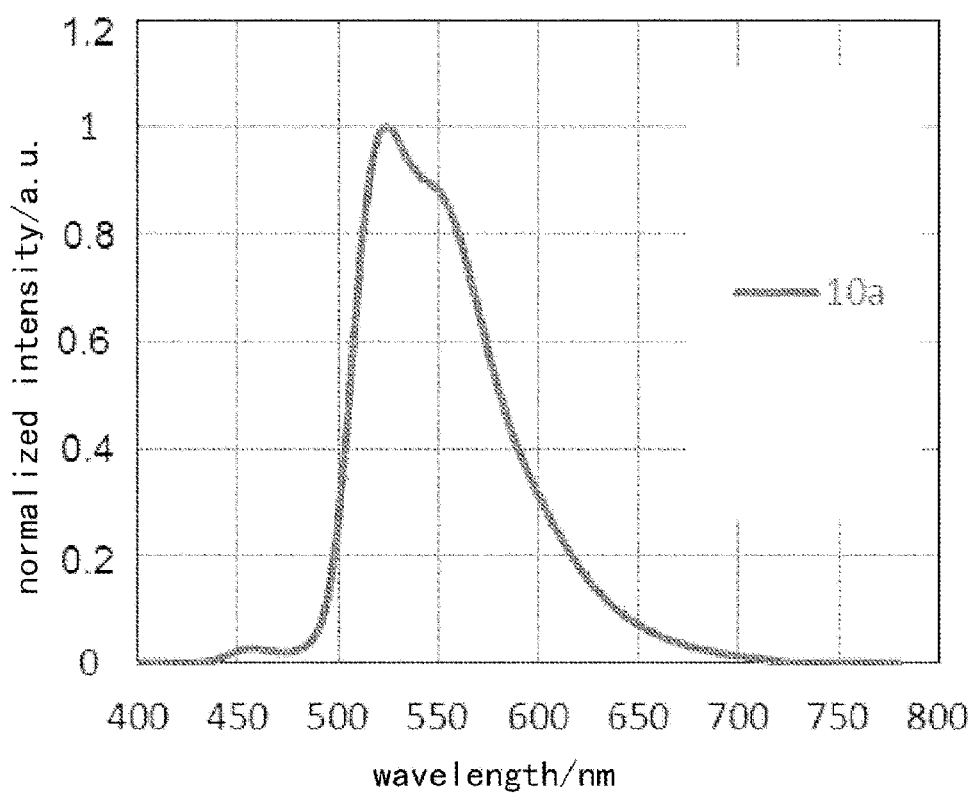

The organic electroluminescent display device may be produced by co-using two processes (for example, the solution process and vacuum thermal evaporation process known in the prior art). On two sides of the interface under different processes, different materials are provided. However, during the conversion between the two processes, the properties of the heterogeneous interface must be affected, in particular, for the light emitting layer. In an example, two colors, red and green, organic light emitting materials are formed by solution process into phosphorescent light emitting layers and blue organic light emitting material is formed by evaporation process into a fluorescent light emitting layer. Taking the region in which the green light emitting material is located as an example, as illustrated in FIG. 1b, it can be seen from the spectrum that an abnormal light occurs near at a wavelength of 460 nm. The light with the wavelength of 460 nm should be the light emitted from the region in which the blue light emitting material is located. Through calculation, it is derived that external quantum efficiency of the region in which the green light emitting material is located is only 8.5% such that the whole efficiency is poor. It means that it is difficult to control the carrier recombination region and it is not easy to achieve both desired efficiency and light color and thus the color of light from the light emitting layer may tend to be abnormal.

Figure 2:
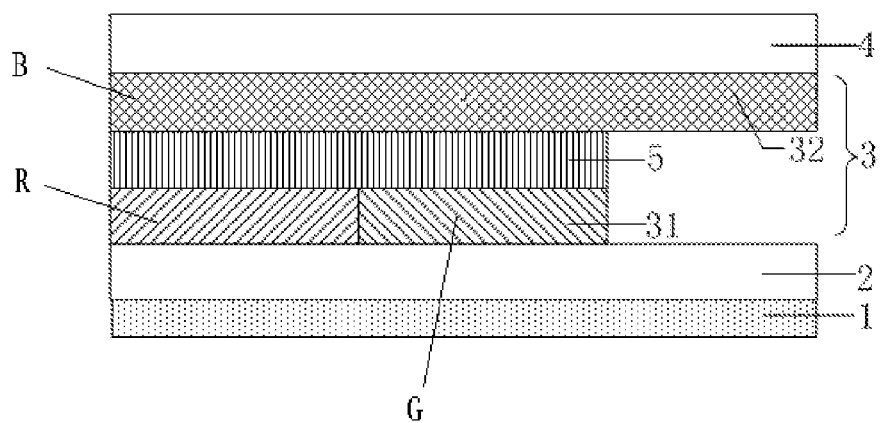
FIG. 2 is a schematic view showing a structure of an organic electroluminescent display device provided by an embodiment of the present invention.

An embodiment of the present invention provides an organic electroluminescent display device, as illuminated in FIG. 2. The organic electroluminescent display device includes: a base substrate 1, and a first electrode 2, an organic light emitting layer 3 and a second electrode 4 arranged sequentially on the base substrate. The organic light emitting layer 3 includes a first light emitting sub-layer 31 and a second light emitting sub-layer 32 arranged in stack, the first light emitting sub-layer 31 having a coverage area less than that of the second light emitting sub-layer 32. A connecting layer 5 is formed by an electron-transporting material and provided between the first light emitting sub-layer 31 and the second light emitting sub-layer 32. A projection area of a pattern of the connecting layer 5 and a projection area of the first light emitting sub-layer 31 on the base substrate 1 are overlapped with each other, for example, completely or partially overlapped.

It should be noted that FIG. 2 is only illustrative. In producing process, the second light emitting layer 32 may be formed directly over the pattern of the first electrode 2. Thus, there is no gap between the first electrode 2 and the second light emitting layer 32. The organic electroluminescent display device provided by an embodiment of the present invention may also have other structures as long as the above conditions are met, instead of being limited to the structure of the organic electroluminescent display device involved in figures in the present application.

In the above organic electroluminescent display device provided by the embodiment of the present invention, since the connecting layer is arranged between the first light emitting sub-layer and the second light emitting sub-layer, the first light emitting sub-layer having a coverage area less than that of the second light emitting sub-layer, and a projection area of a pattern of the connecting layer and a projection area of the first light emitting sub-layer on the base substrate are overlapped with each other, the second light emitting sub-layer has a portion which is not connected to the connecting layer. Further, as the arrangement of the connecting layer affects the carrier transport and position of the carrier recombination region directly, a region in which the first light emitting sub-layer connected to the connecting layer having electron transporting performance is located may form a carrier recombination region while a region in which the portion of the second light emitting sub-layer not connected to the connecting layer is located may also form a carrier recombination region. The two carrier recombination regions are not affected mutually. Thus, it may improve the phenomenon that the organic light emitting layer has abnormal color of light, improve the luminescent efficiency of the display device to further improve the display effects.

As an example, the first light emitting sub-layer 31 is produced by a solution process and the second light emitting sub-layer 32 is produced by a vacuum thermal evaporation process. In an example, the first light emitting sub-layer 31 is a phosphorescent light emitting layer and the second light emitting sub-layer 32 is a fluorescent light emitting layer.

As an example, in the above organic electroluminescent display device provided by the embodiments of the present invention, in order to further meet the requirements for function of electron transport and ensure the electron transport balance such that the region in which the first light emitting sub-layer is located forms the carrier recombination region, the connecting layer may have the lowest unoccupied molecular orbital (LUMO) between the lowest unoccupied molecular orbital of the first light emitting sub-layer and the lowest unoccupied molecular orbital of the second light emitting sub-layer, which may improve the color of light and efficiency of the display device.

As an example, in the above organic electroluminescent display device provided by the embodiments of the present invention, the connecting layer may have a triplet energy level greater than 2.1 eV, so as to facilitate transporting electrons to the first light emitting sub-layer from the second light emitting sub-layer, and to perform the recombination of the electrons and the holes in the carrier recombination region.

As an example, in the above organic electroluminescent display device provided by the embodiments of the present invention, the connecting layer may be produced by a vacuum thermal evaporation process. In this way, the connecting layer may be formed by using the same process as that for forming the second light emitting sub-layer. It thus may simplify the process and save costs.

As an example, in the above organic electroluminescent display device provided by the embodiments of the present invention, the connecting layer may be made from any one of BCP, BPhen, BmPyPB, TPBi, BAlq or TmPyPB, or any combination thereof. The material of the connecting layer may be determined as required and is not limited herein.

Figure 3:
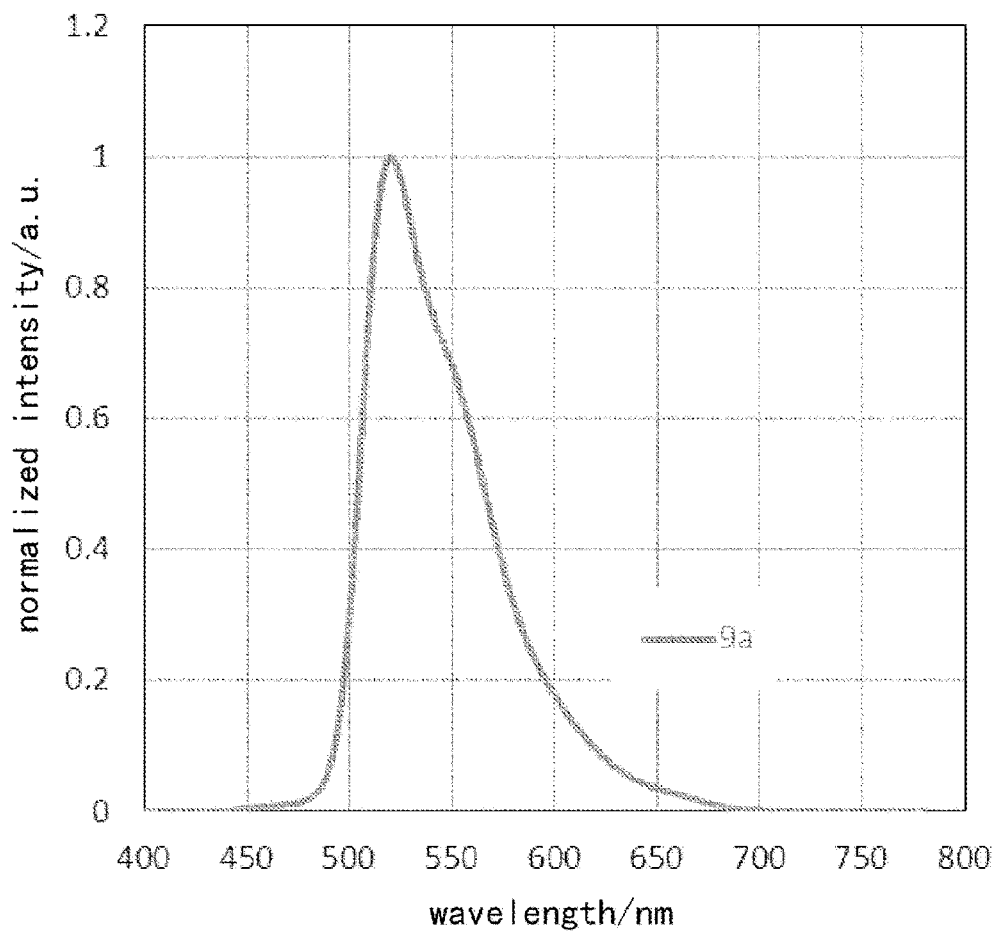
FIG. 3 is a graph showing spectrum of light emitted from a region in which a green light emitting material is located in the organic electroluminescent display device provided by an embodiment of the present invention.

In an example, in the above organic electroluminescent display device provided by the embodiments of the present invention, as illustrated in FIG. 2, the first light emitting sub-layer 31 may include a first light emitting unit and a second light emitting unit arranged in a same layer, and the second light emitting sub-layer 32 may include a third light emitting unit. In this way, the connecting layer 5 is formed between the third light emitting unit and the first light emitting unit and the second emitting unit, and the first light emitting unit and the second light emitting unit are connected to the connecting layer 5 respectively and the third light emitting unit contains a region or portion which is not connected with the connecting layer 5. The first light emitting unit is made from a red light emitting material R, the second light emitting unit is made from a green light emitting material G, and the third light emitting unit is made from a blue light emitting material B. In this way, the red light emitting material and the green light emitting material may emit light, i.e., the first light emitting unit emits red light and the second light emitting unit emits green light, respectively, and the region or portion in the third light emitting unit which is not connected to the connecting layer emits blue light. Thus, it may suppress abnormal color of light and improve the luminescence efficiency. Taking the region in which the green light emitting material is located as an example, as shown in FIG. 3, it can be seen from the spectrum that the color of light is normal and in comparison with FIG. 1b, no abnormal light occur at wavelength of near 460 nm. Through calculation, it can be derived that external quantum efficiency of the region in which the green light emitting material is located is 15.3%, which almost double the external quantum efficiency derived from FIG. 1b. It can be determined that the luminescence efficiency of the region in which the green light emitting material may be enhanced.

It should be noted that respective light emitting units may also made from the light emitting materials with other colors. Number of the light emitting units in the organic light emitting layer, and the light emitting materials forming the respective light emitting units may be determined ad required. They are not intended to be limited herein. FIG. 2 shows that the first light emitting unit, the second light emitting unit and the third light emitting unit are arranged in two layers. In practice, however, the first light emitting unit, the second light emitting unit and the third light emitting unit may also be arranged in three layers. The arrangement of the respective light emitting units may also be determined as required. It is not intended to be limited herein.

Figure 4:
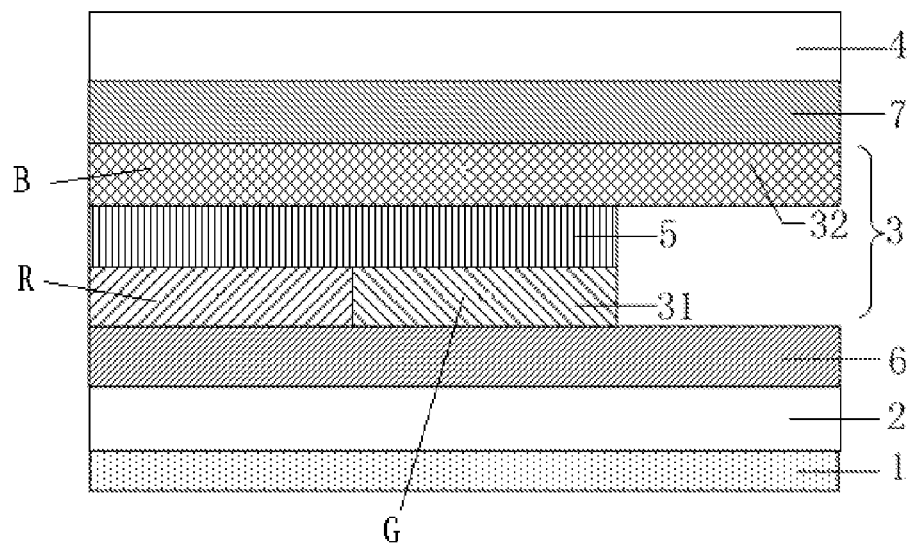
FIG. 4 is a schematic view showing a structure of an organic electroluminescent display device provided by an embodiment of the present invention.

As an example, in the above organic electroluminescent display device provided by the embodiments of the present invention, in order to effectively enhance the luminescence efficiency of the display device, as shown in FIG. 4, the organic electroluminescent display device may further include: a hole transporting layer 6 between the first electrode 2 and the organic light emitting layer 3, and an electron transporting layer 7 between the second electrode 4 and the organic light emitting layer 3. As an example, the hole transporting layer 6 may be produced by a solution process and the electron transporting layer 7 may be produced by a vacuum thermal evaporation process.

Figure 5:
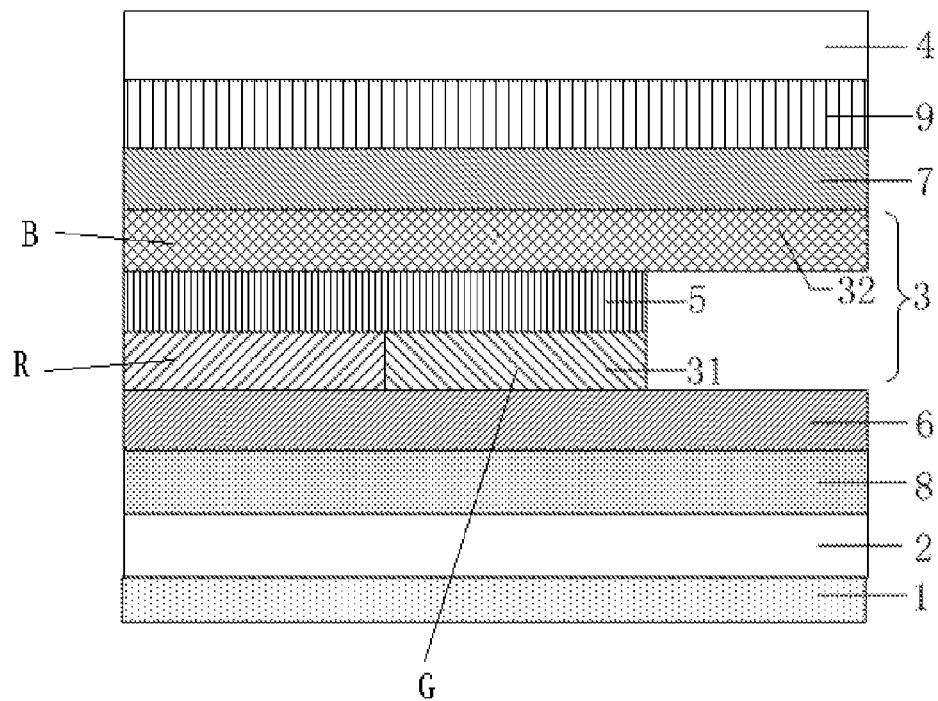
FIG. 5 is a schematic view showing a structure of an organic electroluminescent display device provided by an embodiment of the present invention.

As an example, in the above organic electroluminescent display device provided by the embodiments of the present invention, in order to further enhance the luminescence efficiency of the display device, as shown in FIG. 5, the organic electroluminescent display device may further include: a hole injection layer 8 between the first electrode 2 and the hole transporting layer 6; and an electron injection layer 9 between the second electrode 4 and the electron transporting layer 7. As an example, the hole injection layer 8 may be produced by a solution process and the electron injection layer 9 may be produced by a vacuum thermal evaporation process.

It should be noted that in the above organic electroluminescent display device provided by the embodiments of the present invention, besides the solution process and thermal evaporation process, any other processes for producing the patterned substrate in the prior art may also be used. They are not intended to be limited herein.

As an example, the above organic electroluminescent display device provided by the embodiments of the present invention may be produced as follows: at first, the hole injection layer, the hole transporting layer and the first light emitting sub-layer may be formed by, for example, a solution process; then the connecting layer may be formed by, for example, a vacuum thermal evaporation process; finally, the second light emitting sub-layer, the electron transporting layer and the electron injection layer are formed in sequence by a vacuum thermal evaporation process.

An embodiment of the present invention also provides a display apparatus including the organic electroluminescent display device provided by the above embodiments of the present invention. The display apparatus may be any products or components having display function such as cell phones, tablet computers, televisions, displays, notebook computers, digital camera frames, or navigators. The skilled person in the art should understand the display apparatus may have other necessary parts. The detailed description for these other necessary parts will be omitted herein. They are not intended to limit the embodiments of the present invention. The implementation of the display apparatus may be made with reference to the above embodiments of the organic electroluminescent display device and the repeated parts will not be further described any longer herein.

Embodiments of the present invention provide an organic electroluminescent display device and a display apparatus. The organic electroluminescent display device includes: a base substrate, and a first electrode, an organic light emitting layer and a second electrode arranged sequentially on the base substrate. The organic light emitting layer includes a first light emitting sub-layer and a second light emitting sub-layer arranged in stack, the first light emitting sub-layer having a coverage area less than that of the second light emitting sub-layer. A connecting layer is formed by an electron-transporting material and provided between the first light emitting sub-layer and the second light emitting sub-layer. A projection area of a pattern of the connecting layer and a projection area of the first light emitting sub-layer on the base substrate are overlapped with each other. Since the arrangement of the connecting layer affects the carrier transportation and position of the carrier recombination region directly, the region in which the first light emitting sub-layer connected to the connecting layer is located may form a carrier recombination region while the region in which the portion of the second light emitting sub-layer not connected with the connecting layer is located may also form a carrier recombination region. The two carrier recombination regions are not affected mutually. Thus, it may improve the phenomenon that the organic light emitting layer has abnormal color of light, and improve the luminescence efficiency of the display device to further improve the display effects.

The above embodiments are only intended to explain the present disclosure, instead of limiting the present invention. It would be appreciated by those skilled in the art that various changes, modifications or equivalents made in these embodiments will also fall within the scope of the present invention, without departing from the principles and spirit of the disclosure. The scope of the present invention is delimited by appended claims.

What is claimed is:
1. An organic electroluminescent display device, comprising:
a base substrate, and a first electrode, an organic light emitting layer and a second electrode arranged sequentially on the base substrate, wherein the organic light emitting layer comprises a first light emitting sub-layer and a second light emitting sub-layer arranged in stack, the first light emitting sub-layer having a coverage area less than that of the second light emitting sub-layer;

wherein a connecting layer is formed by an electron-transporting material and provided between the first light emitting sub-layer and the second light emitting sub-layer;

wherein a projection area of a pattern of the connecting layer and a projection area of the first light emitting sub-layer on the base substrate are overlapped with each other; and wherein the second light emitting sub-layer has a portion which is not connected to the connecting layer.

2. The organic electroluminescent display device according to claim 1, wherein the first light emitting sub-layer is produced by a solution process and the second light emitting sub-layer is produced by a vacuum thermal evaporation process.

3. The organic electroluminescent display device according to claim 1, wherein the first light emitting sub-layer is a phosphorescent light emitting layer and the second light emitting sub-layer is a fluorescent light emitting layer.

4. The organic electroluminescent display device according to claim 1, wherein the connecting layer has the lowest unoccupied molecular orbital between the lowest unoccupied molecular orbital of the first light emitting sub-layer and the lowest unoccupied molecular orbital of the second light emitting sub-layer.

5. The organic electroluminescent display device according to claim 1, wherein the connecting layer has a triplet energy level greater than 2.1 eV.

6. The organic electroluminescent display device according to claim 1, wherein the connecting layer is produced by a vacuum thermal evaporation process.

7. The organic electroluminescent display device according to claim 4, wherein the connecting layer is made from any one of BCP, BPhen, BmPyPB, TPBi, BAlq or TmPyPB, or any combination thereof.

8. The organic electroluminescent display device according to claim 1, wherein the first light emitting sub-layer comprises a first light emitting unit and a second light emitting unit arranged in the same layer and the second light emitting sub-layer comprises a third light emitting unit; and wherein the first light emitting unit is made from a red light emitting material, the second light emitting unit is made from a green light emitting material, and the third light emitting unit is made from a blue light emitting material.

9. The organic electroluminescent display device according to claim 8, wherein the first light emitting unit and the second light emitting unit are connected to the connecting layer respectively and the third light emitting unit contains a portion which is not connected to the connecting layer.

10. The organic electroluminescent display device according to claim 1, further comprising:

a hole transporting layer between the first electrode and the organic light emitting layer; and an electron transporting layer between the second electrode and the organic light emitting layer.

11. The organic electroluminescent display device according to claim 10, wherein the hole transporting layer is produced by a solution process and the electron transporting layer is produced by a vacuum thermal evaporation process.

12. The organic electroluminescent display device according to claim 10, further comprising:

a hole injection layer between the first electrode and the hole transporting layer; and an electron injection layer between the second electrode and the electron transporting layer.

13. The organic electroluminescent display device according to claim 12, wherein the hole injection layer is produced by a solution process and the electron injection layer is produced by a vacuum thermal evaporation process.

14. A display apparatus comprising an organic electroluminescent display device, the organic electroluminescent display device comprising:

a base substrate, and a first electrode, an organic light emitting layer and a second electrode arranged sequentially on the base substrate, wherein the organic light emitting layer comprises a first light emitting sub-layer and a second light emitting sub-layer arranged in stack, the first light emitting sub-layer having a coverage area less than that of the second light emitting sub-layer;

wherein a connecting layer is formed by an electron-transporting material and provided between the first light emitting sub-layer and the second light emitting sub-layer;

wherein a projection area of a pattern of the connecting layer and a projection area of the first light emitting sub-layer on the base substrate are overlapped with each other; and wherein the second light emitting sub-layer has a portion which is not connected to the connecting layer.

15. The display apparatus according to claim 14, wherein the first light emitting sub-layer is produced by a solution process and the second light emitting sub-layer is produced by a vacuum thermal evaporation process.

16. The display apparatus according to claim 14, wherein the connecting layer has the lowest unoccupied molecular orbital between the lowest unoccupied molecular orbital of the first light emitting sub-layer and the lowest unoccupied molecular orbital of the second light emitting sub-layer.

17. The display apparatus according to claim 14, wherein the connecting layer is produced by a vacuum thermal evaporation process.

18. The display apparatus according to claim 14, wherein the first light emitting sub-layer comprises a first light emitting unit and a second light emitting unit arranged in a same layer and the second light emitting sub-layer comprises a third light emitting unit; and wherein the first light emitting unit is made from a red light emitting material, the second light emitting unit is made from a green light emitting material, and the third light emitting unit is made from a blue light emitting material.

19. The display apparatus according to claim 14, wherein the organic electroluminescent display device further comprises:

a hole transporting layer between the first electrode and the organic light emitting layer; and an electron transporting layer between the second electrode and the organic light emitting layer.

20. The display apparatus according to claim 19, wherein the organic electroluminescent display device further comprises:

a hole injection layer between the first electrode and the hole transporting layer; and
an electron injection layer between the second electrode and the electron transporting layer.

* * * * *